United States Patent
Ideta

[11] Patent Number: 6,073,207
[45] Date of Patent: Jun. 6, 2000

[54] MICROCOMPUTER COMPRISING FLASH EEPROM

[75] Inventor: Masako Ideta, Tokyo, Japan

[73] Assignee: NEC Corporation, Tokyo, Japan

[21] Appl. No.: 08/979,151

[22] Filed: Nov. 26, 1997

[30] Foreign Application Priority Data

Nov. 28, 1996 [JP] Japan .................................. 8-317500

[51] Int. Cl.[7] .................................................. G06F 12/06
[52] U.S. Cl. .............................. 711/103; 714/42; 395/712
[58] Field of Search ....................... 711/103; 365/181.01, 365/185.33; 395/652, 182.06, 712, 183.18; 714/42

[56] References Cited

U.S. PATENT DOCUMENTS

| | | | |
|---|---|---|---|
| 5,197,034 | 3/1993 | Fandrich et al. | 365/227 |
| 5,544,312 | 8/1996 | Hasbun et al. | 395/183.18 |
| 5,594,903 | 1/1997 | Bunnell et al. | 395/712 |
| 5,701,492 | 12/1997 | Wadsworth et al. | 395/712 |
| 5,715,423 | 2/1998 | Levy | 711/103 |
| 5,740,349 | 4/1998 | Hasbun et al. | 395/182.06 |
| 5,815,706 | 9/1998 | Stewart et al. | 395/652 |

FOREIGN PATENT DOCUMENTS

| | | |
|---|---|---|
| 0 561 271 A2 | 9/1993 | European Pat. Off. . |
| 0 561 271 A3 | 9/1993 | European Pat. Off. . |
| 1-298600 | 12/1989 | Japan . |
| 2-89555 | 7/1990 | Japan . |
| 5-266219 | 10/1993 | Japan . |
| 5-325576 | 12/1993 | Japan . |
| 7-98991 | 4/1995 | Japan . |

OTHER PUBLICATIONS

Furuno, T., et al., "High Reprogramming Speed 16–Mbit Flash Memory," Hitachi Review, vol. 43, No., 5, pp. 221–224 (Oct. 1994).

IC Memory No. 2 Databook: "HN28F1600 Series Sector Erase Flash Memory," Hitachi Europe, XP002098794 (1993).

*Primary Examiner*—Do Hyun Yoo
*Assistant Examiner*—Nasser Moazzami
*Attorney, Agent, or Firm*—Foley & Lardner

[57] ABSTRACT

In a microcomputer, a programmable memory such as a flash EEPROM has a first memory region and a second memory region. In this case, the first memory region stores an application program, while the second memory region storing a boot program for rewriting the application program. Under this condition, a selecting circuit selects the first memory region except the second memory region. Further, only the selected first memory region is erased.

5 Claims, 3 Drawing Sheets

| BOOT BLOCK ERASE | ADRESS {15 : 14} | BLOCK 0 | BLOCK 1 | BLOCK 2 | BLOCK 3 |
|---|---|---|---|---|---|
| 0 | 0 0 | 0 | 1 | 1 | 1 |
|   | 0 1 | 1 | 0 | 1 | 1 |
|   | 1 0 | 1 | 1 | 0 | 1 |
|   | 1 1 | 1 | 1 | 1 | 0 |
| 1 | 0 0 | 1 | 0 | 0 | 0 |
|   | 0 1 | 1 | 1 | 0 | 0 |
|   | 1 0 | 1 | 1 | 1 | 0 |
|   | 1 1 | 1 | 1 | 1 | 1 |

MICROCOMPUTER COMPRISING FLASH EEPROM

BACKGROUND OF THE INVENTION

This invention relates to a microcomputer comprising a semiconductor memory which is programmable and erasable, and in particular, to a microcomputer comprising a flash EEPROM, and a method of erasing the flash EEPROM.

In general, this kind of microcomputer comprises a flash EEPROM wherein an user program, such as an application program, can be programed.

Conventionally, proposal has been made about so called a self-programing system in which a memory content of the flash memory can be rewritten to the other program by a user on the condition that the microcomputer is mounted on a mounting substrate, as disclosed in Japanese Unexamined Patent Publication No. Hei. 5-266219 (reference 1). The reference 1 discloses a mode wherein a program is directly written to the flash EEPROM by a general purpose PROM writer and a mode wherein a program is written under the control of a central processing unit (CPU) inside the microcomputer, as a mode for rewriting the program in the flash EEPROM by the user. Where the program from the general-purpose PROM writer is used, the CPU inside the microcomputer is separated from the flash EEPROM, and the program in the flash EEPROM can be rewritten under the control of the general-purpose PROM writer.

On the other hand, where the program in the flash EEPROM is rewritten under the control of the CPU, a rewrite control program for controlling the rewrite of the program is necessary besides a program to be rewritten. The rewrite control program is stored in the flash EEPROM or a mask ROM in the above reference 1. Where the rewrite control program is stored in the flash EEPROM, the rewrite control program is transferred to the RAM with a transfer control program. Thereafter, a new program is written to the flash EEPROM under the control of the rewrite control program stored in the RAM. Further, where the rewrite control program is stored in the mask ROM, the flash EEPROM is rewritten by the rewrite control program in the mask ROM.

At any rate, the flash EEPROM must be once erased to rewrite the flash memory. Therefore, proposals have been made about a method for erasing the entire memory region comprising a plurality of memory cells, and a method for dividing the memory region into a plurality blocks and erasing each block, as methods for erasing the flash EEPROM. In such a method for erasing the entirety, all programs in the flash EEPROM can be erased in a short duration, whereas a long duration is necessary to rewrite the programs because all programs must be rewritten.

Further, where the flash EEPROM is divided to a plurality of blocks, the erasing operation can be carried out for each block. However, when the number of the blocks is increased, a long duration is necessary to erase the flash EEPROM, since about two seconds is required to erase each of the blocks.

Conventionally, Unexamined Japanese Patent Publication No. H5-325576 (reference 2) discloses such a method that a latch is provided in accordance with the block of the flash EEPROM, the block to be erased is designated by the latch and the designated block is erased, as a method for erasing the flash memory. Where this easing method is employed, an arbitrary block can be erased. However, the number of the latches must be increased with the number of the blocks. In addition, means for designating the latch is needed.

Further, Unexamined Japanese Patent Publication No. H7-98991 (reference 3) discloses such a non-volatile semiconductor memory that a plurality address signals can be latched for a plurality of erasing blocks and thereby, the block can be once erased with various combination. Such a structure has a limitation that the number of the address signals must be equal to the number of the blocks. Therefore, the number of the latches must be increased with the number of the blocks.

On the other hand, User's demand has been recently enhanced for the microcomputer which is specialized for each user by storing the program necessary to each user. To comply with this demand, it must be considered that a program (boot program) for rewriting a user program is necessary in addition to an user program. In this case, the boot program is different in accordance with each user and the block for storing the boot program is also different in accordance with the boot program. In this circumstance, where an occurrence of a bag is considered, it is desirable that the user program itself can be rewritten. However, it is rare that the boot program itself is rewritten because the boot program is inherent to the user in many cases.

In this event, it may be considered that both the user program and the boot program may be stored in the flash EEPROM in accordance with the user's demand, and further the references 1 to 3 are applied to erase the programs.

However, none of the references 1 to 3 suggest that the user program and the boot program are designated and stored in the flash EEPROM. In the reference 1, a rewrite control program is transferred to a RAM and thereafter, all blocks is erased. Further, although the references 2 and 3 disclose that the block to be erased is designated by the latch, neither of the references disclose a relation between the user and boot programs and the erasing block. In addition, neither of the references discloses an erasing circuit and an erasing method in the case that the user program and the boot program are stored in the flash EEPROM. For example, where the user program is stored in a plurality of blocks, a long duration is necessary to erase the flash EEPROM because the memory content must be erased for each block. Further, where the latch is provided in accordance with the block like the references 2 and 3, the control of the latch is difficult.

SUMMARY OF THE INVENTION

It is an object of this invention to provide a microcomputer wherein both a boot program and an user program are stored in a flash EEPROM.

It is another object of this invention to provide a microcomputer which comprises an erasing circuit suitable for a flash EEPROM wherein both a boot program and an user program are stored.

It is still another object of this invention to provide a microcomputer comprising an erasing circuit which is capable of rapidly erasing only an user program where both a boot program and an user program are stored by dividing to a plurality of blocks.

It is still further object of this invention to provide an erasing method which is capable of selecting a mode wherein an erasing operation can be performed for each block and a mode wherein a program region except a boot program can be erased.

According to this invention, a programmable memory such as a flash EEPROM has a first memory region and a second memory region. In this case, the first memory region stores an application program, while the second memory region storing a boot program for rewriting the application program. Under this condition, selecting means selects the first memory region except the second memory region. Further, erasing means erases only the selected first memory region.

More specifically, the memory is divided into a plurality of blocks. The application program is stored in a first blocks, while the boot program is stored in a second block. In this condition, the selecting means selects the first blocks except the second block, and the erasing means erases only the first blocks.

According to this invention, only the application program except the boot program can be rapidly erased where both the boot program and the application program are stored in the programmable memory such as a flash EEPROM.

DESCRIPTION OF THE PREFERRED EMBODIMENT

Figure 1:
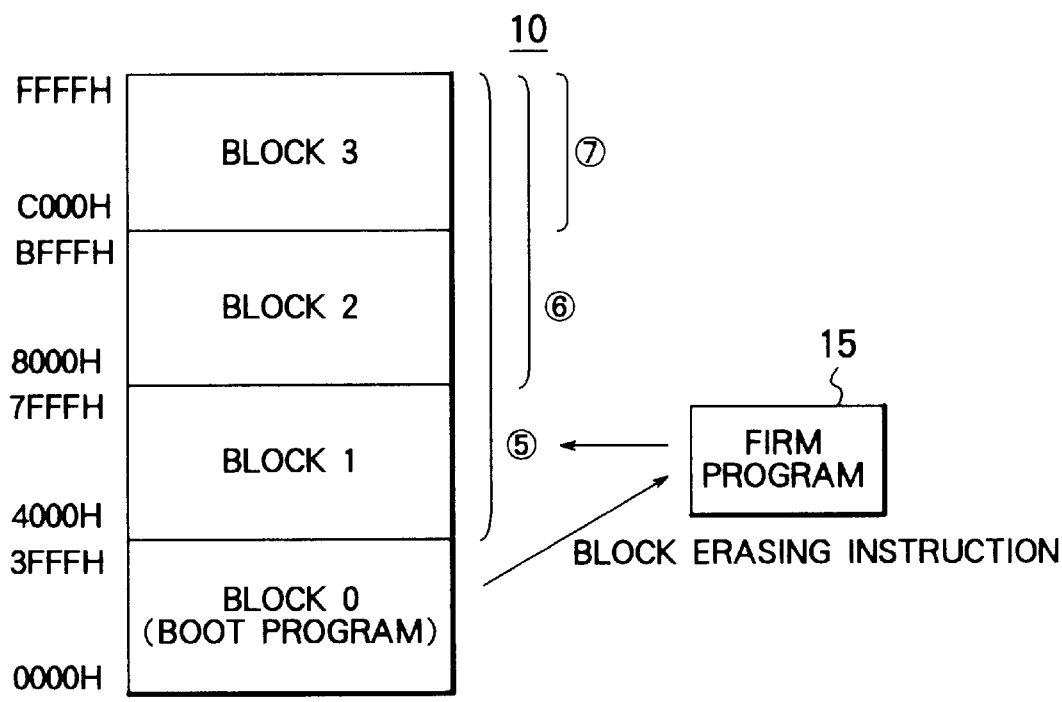
FIG. 1 is a block diagram showing an erasing operation of blocks according to an embodiment of this invention.
Figure 2:
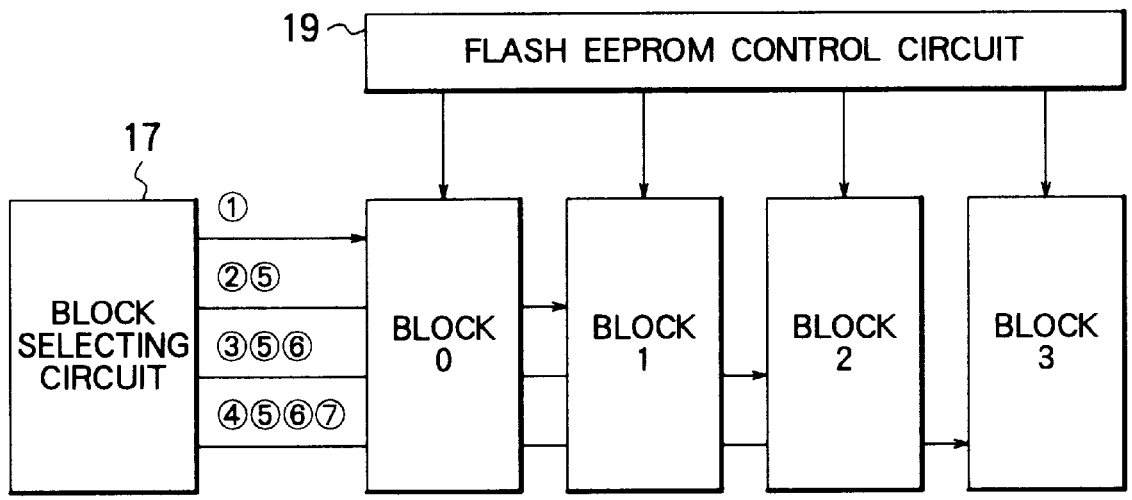
FIG. 2 is a block diagram showing a partial circuit structure for performing an erasing operation of blocks.

Referring to FIGS. 1 and 2, description will be made about an erasing operation of a flash EEPROM according to an embodiment of this invention.

The illustrated flash EEPROM 10 is divided to four blocks 0 to 3. Each of the blocks has an address number and a memory capacity equal to each other. However, each of the blocks may have a memory capacity different from each other and the flash EEPROM may be divided into further many blocks.

In the illustrated example, a boot program corresponding to the user of the microcomputer is stored in the block 0. The boot program is stored to rewrite an user application program. On the other hand, the user application program is stored in the other blocks 1 to 3. In this case, a rewrite control program is stored in a ROM 15 in the form of a firmware.

In FIG. 1, the boot program stored in the block 0 is operated with a start operation of the user. Thereby, a block erasing designation instruction is sent to the rewrite control program stored in the ROM 15. Where the block erasing designation instruction is given, block selecting signals for selecting the blocks to be erased are supplied from a block selecting circuit 17 to the blocks 0 to 3 by the rewrite control program, as shown in FIG. 2.

In the example illustrated in FIG. 2, a flash EEPROM control circuit 19 is connected to each of the blocks 0 to 3. The blocks 0 to 3 which are selected by the block selecting circuit 17 are erased under the control of the flash EEPROM control circuit 19. As shown in FIG. 2, the blocks 0 to 3 are individually designated by block designation signals ①, ②, ③ and ④. In this event, each of the blocks can be erased individually and exclusively under the control of the flash EEPROM control circuit 19.

In addition, the block designation signal ⑤ is supplied from the block selecting circuit 17 to the blocks 1, 2, and 3. Consequently, the blocks 1, 2 and 3 except the block 0 can be simultaneously erased. Likewise, the block designation signal ⑥ is supplied to the blocks 2 and 3, and thereby the blocks 2 and 3 can be simultaneously erased. Further, the block designation signal ⑦ is supplied to only the block 3 to erase only the block 3 like the block designation signal ④.

In this case, erasing regions of the block designation signals ⑤, ⑥ and ⑦ are illustrated in FIG. 1, respectively. In particular, the block designation signal ⑤ can erase regions except the block 0 in which a boot program is stored. Therefore, where the user programs are stored in the blocks 1 to 3, the user program can be once erased without erasing the boot program in the block 0. Accordingly, the user programs except the boot program can be rapidly erased with such a structure.

Figure 3:
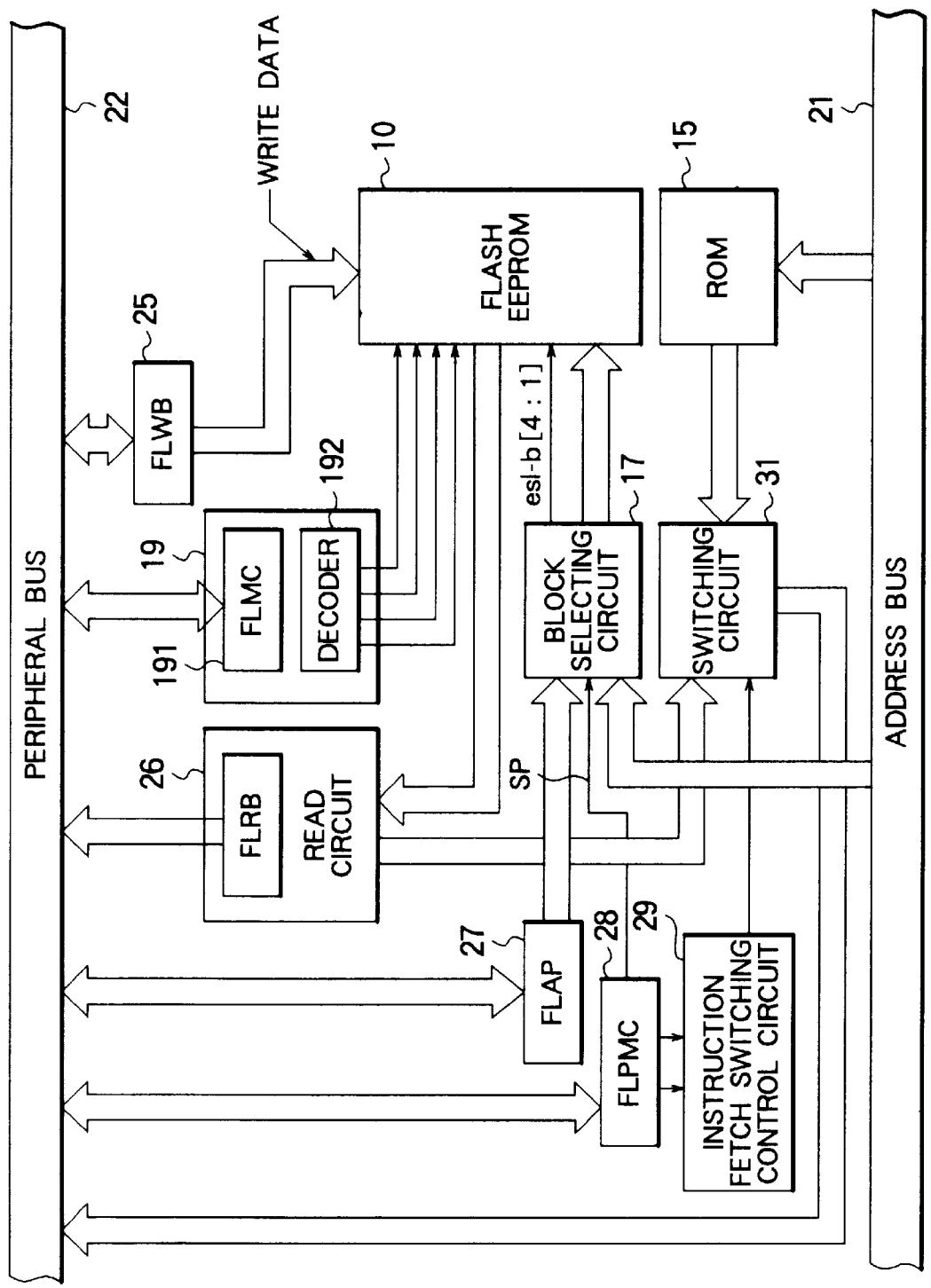
FIG. 3 is a block diagram showing a detail structure of a microcomputer according to an embodiment of this invention.

FIG. 3 shows a microcomputer according to this embodiment.

In the example, a connecting relation of the flash EEPROM 10, the ROM 15, the block selecting circuit 17 and the flash EEPROM control circuit 19 shown in FIGS. 1 and 2 is concretely illustrated.

A microcomputer shown in FIG. 3 comprises an address bus 21 and an peripheral bus 22. The both buses 21 and 22 are connected to a CPU (not shown). The flash EEPROM 10 is connected to the flash EEPROM control circuit 19 and a flash write control circuit 25 for writing a data for the flash EEPROM 10. Further, the flash EEPROM 10 is connected to a read circuit 26 for reading a data from the flash EEPROM 10. The illustrated flash write circuit 25 is composed of a flash write buffer FLWM, while the read circuit 26 comprises a flash read buffer FLRB.

In addition, the flash EEPROM control circuit 19 comprises a flash mode control register (FLMC) 191 and a decoder 192, while FLMC 191 receives and sends an instruction and a data via the peripheral bus 22. The decoder 192 decodes the instruction from the FLMC 191 and sends flash control signals for erasing, writing and reading the flash EEPROM 10. In this case, the illustrated FLPMC 28 sends a self-programming mode signal SP representing a self-programing mode to the flash EEPROM 10.

The block selecting circuit 17 is connected to the address bus 21, a flash address pointer (FLAP) 27 and the flash programing control register (FLPMC) 28. The FLAP 27 indicates a head address of a region to be written, read and erased for the block selecting circuit 17. The FLPMC 28 discriminates a normal mode and a self-programing mode. In addition, the FLPMC 28 has a boot block erasing bit for indicating a mode for entirely erasing regions (blocks 1 to 3) except a region (block 0) in which the boot program is stored. Further, the FLPMC 28 is connected to a instruction fetch switching circuit 29. The instruction fetch switching circuit 29 supplies a switching signal to a switching circuit 31 in accordance with the mode of the FLPMC 28.

The switching circuit 31 is connected to the ROM 15 and the read circuit 26. In this case, the switching circuit 31 stores the write control program in the form of the firmware, while the read circuit 26 retains an instruction read from the flash EEPROM 10. The switching circuit 31 selects the read circuit 26 where the normal mode is set to the FLPMC. In this condition, the instruction from the flash EEPROM 10 is sent to the peripheral bus 22 via the switching circuit 31. On the other hand, where the self-programming mode is designated by the FLPMC 28, the switching circuit 31 selects the ROM 15. Consequently, the flash EEPROM control circuit 19 and the FLWB 25 operates to write and erase the flash EEPROM 15 in accordance with the firmware of the ROM 15.

Subsequently, description will made about an erasing operation of the flash EEPROM which is performed in accordance with the firmware of the ROM 15.

The flash EEPROM 10 can perform an erasing operation for each block and can entirely erase regions except a region in which the boot program is stored, as shown in FIGS. 1 and 2. In this event, the boot program is stored in the block 0 of the flash EEPROM 10 by the user, as shown in FIG. 1.

More specifically, where the boot block erasing bit of the FLPMC 28 is logic "1", the block selecting circuit 17 performs a logical calculation for the given address and the boot block erasing bit and entirely erases the blocks except the block 0 in which the boot program is stored.

Figures 4, 5:
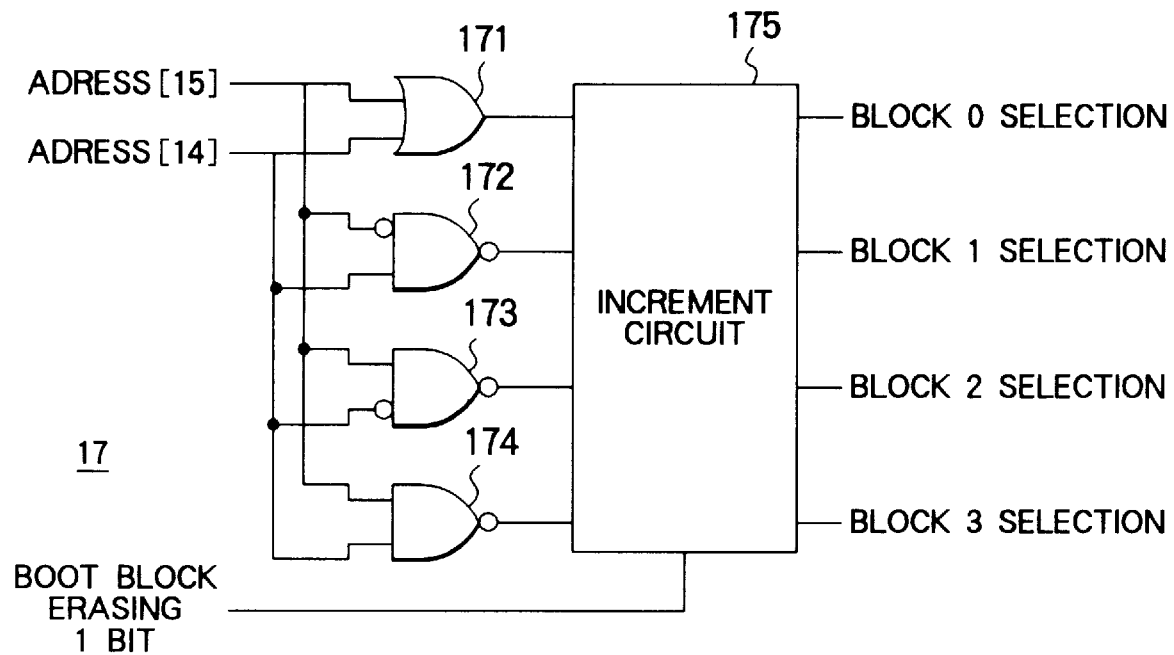
FIG. 4 is a block diagram showing a detail of a block selecting circuit in FIGS. 2 and 3.
FIG. 5 is a truth table showing an operation of the block selecting circuit in FIG. 4.

Referring to FIGS. 4 and 5 together with FIG. 3, two bits of high order (fourteenth and fifteenth bits among sixteen bits) is given to the block selecting circuit 17 as an address signal. The block selecting circuit 17 shown in FIG. 4 comprises four logic gates 172 to 174 and an increment circuit 175.

If the fifteenth and fourteenth bits is "00" when the boot block erasing bit is logic "0", only an output of the logic gate (OR gate) 171 becomes "0" and outputs of the other logic gates 172 to 174 become logic "1". In this state, only the block 0 is selected to be erased and written. Similarly, if the fifteenth and the fourteenth bits become "01", "10" and "11", respectively when the boot block erasing bit is logic "0", the logic gates 172, 173 and 174 corresponding to the block 1, 2 and 3 become logic "0". As a result, the blocks 1, 2 and 3 are selected, respectively.

On the other hand, if the logic "1" is given as the boot block erasing bit when the fifteenth and the fourteenth bits are "00", "1" is added to the output "0111" corresponding to the blocks 1, 2, 3 and 4 to become "1000", as shown in FIG. 5. This means that only the block 0 becomes non-selecting state and the other blocks 1, 2 and 3 become the selecting state. Therefore, the blocks 1, 2 and 3 except the block 0 (the boot program) become the selecting state. Consequently, the blocks 1, 2 and 3 can be erased once.

If the boot block erasing bit is logic "1" when the fifteenth and the fourteenth bits are "01", outputs of the logic gates 171 to 174 become "1011". Further, the increment circuit 175 adds a logic "1" to the outputs (1011) of the logic gates 171 to 174 to obtain "1100". Consequently, the blocks 2 and 3 become the selecting state. Similarly, if the boot block erasing bit becomes a logic "1" when outputs of the logic gates 171 to 174 is "1101", the output of the increment circuit 175 becomes "1110". In addition, if the boot erasing bit is a logic "1" when the outputs of the logic gates 171 to 174 become "1110", the output of the increment circuit 175 becomes "1111".

In this event, a detailed description about the increment circuit 175 is omitted because the increment circuit 175 can be easily constituted by combining the known half adders.

Although the number of the blocks is four in the above mentioned embodiment, the number of the blocks is not limited to four in this invention.

According to this invention, a hardware such as a latch is unnecessary for the block, different from the conventional microcomputer. Further, the flash EEPROM is divided to arbitrary size, and a bit position of the address signal is determined in accordance with each block. Consequently, the block different in the size can be individually selected and a region except the boot program region can be erased once.

What is claimed is:

1. A microcomputer comprising:

a programmable memory having a plurality of blocks, the blocks being divided into first blocks which store a first program and a second block which stores a second program;

a circuit for supplying address signals which indicates the block to be erased;

a circuit for supplying a block erasing bit which represents whether or not said second program is to be erased;

a circuit for erasing the selected block;

wherein said block erasing bit has a first state when said second program may be erased, while said erasing block bit has a second state when said second program is not to be erased; and said selecting circuit operable in a first mode when said block erasing bit is in the first state for selecting any one of said first and second blocks for erasing only said selected block; and said selecting circuit operable in a second mode when said block erasing bit is in the second state for selecting one of (1) one of said first blocks and (2) a plurality of said first blocks for simultaneously erasing said selected plurality of first blocks.

2. A microcomputer as claimed in claim 1, wherein;

said selecting circuit is operable in said second mode for selecting all of said blocks except said second block when the block erasing bit is in the second state.

3. A microcomputer as claimed in claim 1, wherein;

said first program comprises an application program, while said second program comprises a boot program for rewriting the application program.

4. A microcomputer as claimed in claim 1, wherein;

said selecting circuit comprises a plurality of logic gates which are responsible to the address signals, and an increment circuit which is connected to said logic gates and which is responsive to the block erasing bit.

5. A microcomputer as claimed in claim 1, wherein;

said programmable memory comprises a flash EEPROM.

* * * * *